United States Patent
Barthel et al.

(10) Patent No.: US 8,170,235 B2
(45) Date of Patent: May 1, 2012

(54) HEARING APPARATUS WITH UNSYMMETRICAL TONE BALANCE UNIT AND CORRESPONDING CONTROL METHOD

(75) Inventors: Roland Barthel, Erlangen (DE); Robert Bäuml, Eckental (DE); Eghart Fischer, Schwabach (DE)

(73) Assignee: Siemens Audiologische Technik GmbH, Erlanger (DE)

( * ) Notice: Subject to any disclaimer, the term of this patent is extended or adjusted under 35 U.S.C. 154(b) by 1246 days.

(21) Appl. No.: 11/906,491

(22) Filed: Oct. 2, 2007

(65) Prior Publication Data
US 2008/0130928 A1 Jun. 5, 2008

(30) Foreign Application Priority Data
Oct. 2, 2006 (DE) .......................... 10 2006 046 699

(51) Int. Cl.
*H03G 5/00* (2006.01)
(52) U.S. Cl. .......... 381/98; 381/101; 381/102; 381/104; 381/107; 381/108
(58) Field of Classification Search .................... 381/98, 381/101, 102, 104, 107, 108
See application file for complete search history.

(56) References Cited

U.S. PATENT DOCUMENTS

| | | | |
|---|---|---|---|
| 4,187,413 A | 2/1980 | Moser | |
| 6,175,635 B1 | 1/2001 | Meyer et al. | |
| 6,647,123 B2 * | 11/2003 | Kandel et al. | 381/318 |
| 7,010,133 B2 | 3/2006 | Chalupper et al. | |
| 7,068,802 B2 | 6/2006 | Schulz et al. | |

FOREIGN PATENT DOCUMENTS

| | | |
|---|---|---|
| DE | 27 16 336 B1 | 7/1978 |
| DE | 31 41 420 C2 | 5/1983 |
| DE | 103 08 483 A1 | 9/2004 |
| DE | 101 31 964 B4 | 11/2005 |
| EP | 0 917 398 A2 | 5/1999 |
| EP | 1432282 A2 | 6/2004 |
| WO | 0021332 A2 | 4/2000 |

OTHER PUBLICATIONS

Harvey Dillon, "Hearing Aids", 2001, pp. 308-313, ISBN 1-58890-052-S, Boomerang Press, Turramurra, Australia.

* cited by examiner

*Primary Examiner* — David Vu
*Assistant Examiner* — Brandon Fox

(57) ABSTRACT

For hearing apparatus and especially for hearing devices a tone balance unit is to be able to be used even under difficult general conditions. Therefore a hearing apparatus with a signal processing device, through which signals are able to be processed in a number of frequency channels, and a control device for controlling the level of the individual frequency channels are provided. The setting device features an unsymmetrical tone balance unit related to a predetermined frequency with which at least one lower and at least one upper channel of the number of frequency channels related to a predetermined frequency is able to be simultaneously unsymmetrically adjusted relative to the predetermined frequency. Thus for example a tone balance unit can also be used with a low feedback limit in the upper frequency range.

6 Claims, 3 Drawing Sheets

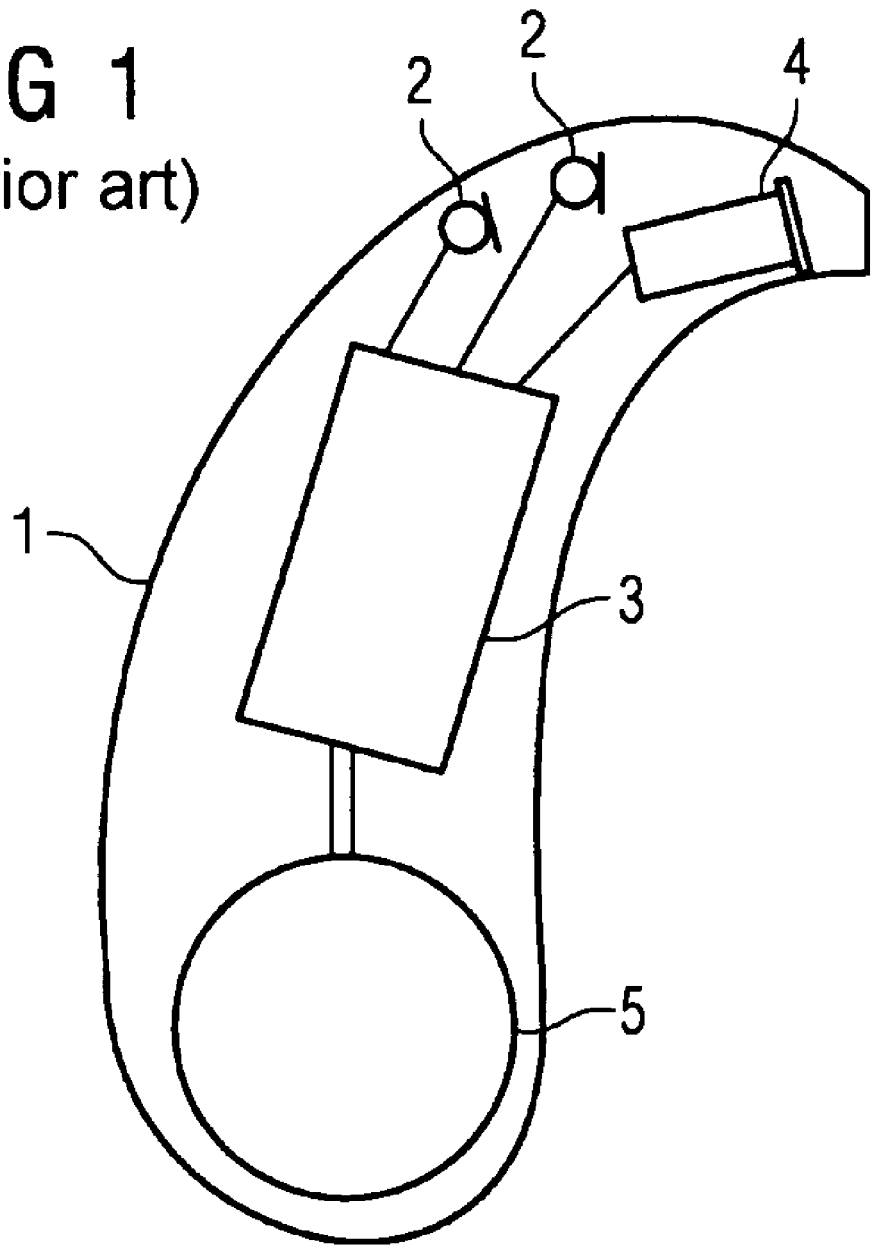

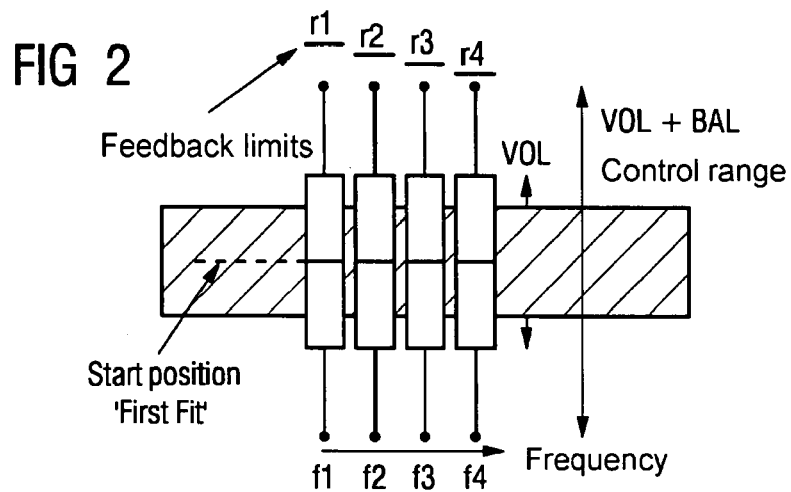
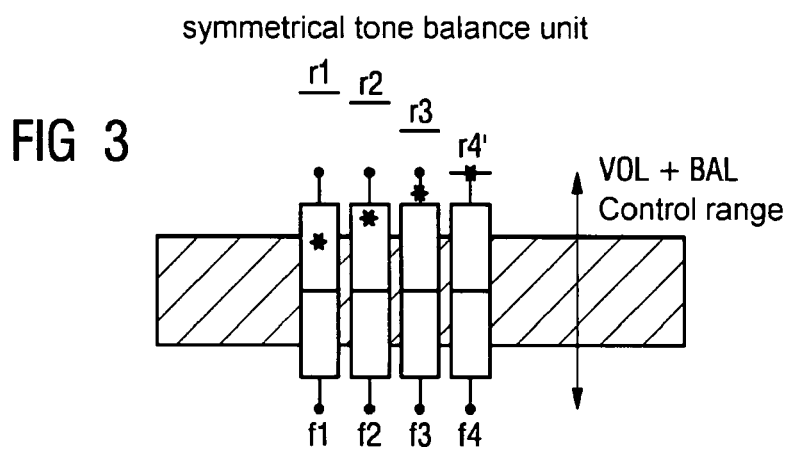
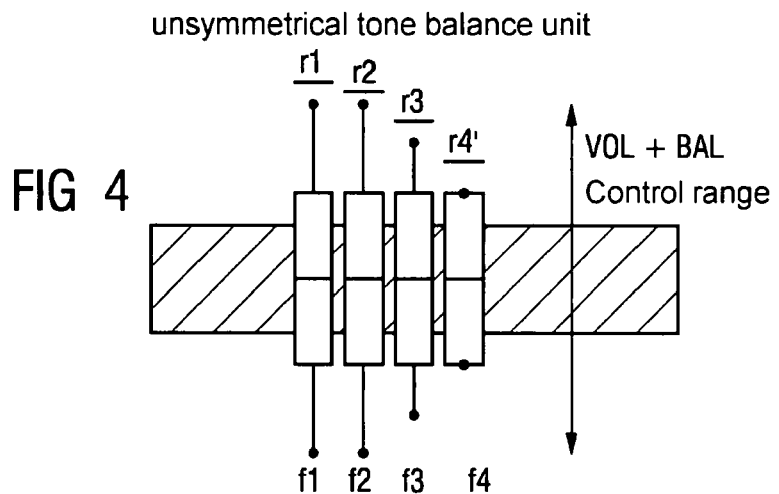

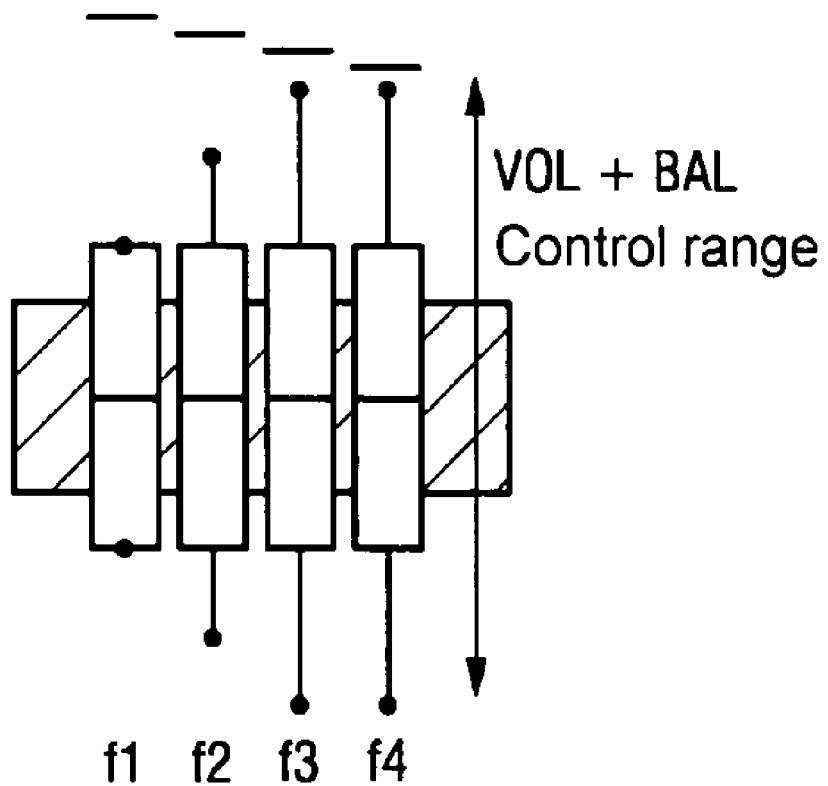

HEARING APPARATUS WITH UNSYMMETRICAL TONE BALANCE UNIT AND CORRESPONDING CONTROL METHOD

CROSS REFERENCE TO RELATED APPLICATIONS

This application claims priority of German application No. 102006046699.3 DE filed Oct. 2, 2006, which is incorporated by reference herein in its entirety.

FIELD OF INVENTION

The present invention relates to a hearing apparatus with a signal processing device, through which signals are able to be processed in a number of frequency channels, and to a control device for setting the level of the individual frequency channels. In addition the present invention relates to a corresponding method for controlling a hearing apparatus. Hearing apparatus in this document is to be understood as any wearable and non-wearable device for creating an audible sound. In particular however the term covers a hearing device, a headset or an earpiece.

BACKGROUND OF INVENTION

Hearing devices are wearable hearing apparatus used to assist the hard-of-hearing. To meet the numerous individual requirements different designs of hearing device are provided such as behind-the ear (BTE) hearing devices, in-the-ear (ITE) hearing devices and Concha hearing devices. The typical configurations of hearing device are worn on the outer ear or in the auditory canal. Above and beyond these designs however there are also bone conduction hearing aids, implantable or vibro-tactile hearing aids available on the market. In such hearing aids the damaged hearing is simulated either mechanically or electrically.

Hearing devices principally have as their main components an input converter, an amplifier and an output converter. The input converter is as a rule a sound receiver, e.g. a microphone, and/or an electromagnetic receiver, e.g. an induction coil. The output converter is mostly implemented as an electroacoustic converter, e.g. a miniature loudspeaker or as an electromechanical converter, e.g. bone conduction earpiece. The amplifier is usually integrated into a signal processing unit. This basic structure is shown in FIG. 1 using a behind-the ear hearing device as an example. One or more microphones 2 for recording the sound from the surroundings are built into a hearing device housing 1 worn behind the ear. A signal processing unit 3, which is also integrated into the hearing device housing 1, processes the microphone signals and amplifies them. The output signal of the signal processing unit 3 is transmitted to a loudspeaker or earpiece 4 which outputs the acoustic signal. The sound is transmitted, if necessary via a sound tube which is fixed with an otoplastic in the auditory canal, to the hearing device wearer's eardrum. The power is supplied to the hearing device and especially to the signal processing unit 3 by a battery 5 also integrated into the hearing device housing 1.

SUMMARY OF INVENTION

Different hearing requirements of hearing aid wearers explain the desire for a tone balance unit in the hearing device. The obvious implementation of a tone balance unit consists of pressing a corresponding button (for example "more highs") to increase the highs to the same extent as the lows are reduced. This solution can however give rise to a few problems. Thus for example the impression of loudness is predominantly produced by the low frequency bands. If the tone balance unit as just described is symmetrical, the signal not only appears to become brighter but also quieter, since the lows which appear loud are reduced.

Another problem is the restriction of the highs to avoid feedback effects which frequently occur at higher frequencies. If the control range is restricted there to prevent feedback, the usable control range of a balance symmetrical tone balance unit may possibly be very small.

There has not previously been a tone balance unit in a hearing device. Balance units are used however in the fitting of hearing devices in order to modify the tone appropriately during fitting. In such cases the problems described above often occur, but acoustic technicians are able to easily overcome them using their specialist knowledge. In the case of implementation of a tone balance unit in a hearing device this specialist knowledge cannot be called upon by the user.

A method for adapting a hearing device to an instantaneous acoustic situation is known from publication EP 1 432 282 A2. Sets of parameters are selected automatically on the basis of an identified environment situation. In this case the parameters of a parameter set can be adjusted simultaneously and jointly in one of two opposite directions. Thus high frequency signal components are raised and low-frequency signal components lowered with a tone balancing system or vice versa. Regarding tone balance the reader is referred to the publication by Harvey Dillon entitled "Hearing Aids" (Boomerang Press, 2001, ISBN 1-58890-052-5), especially its Chapter 11.1.6 entitled "Tonal quality" (Page 308).

In addition patent application DE 101 31 964 B4 shows a method for operation of a digital programmable hearing device. In this device the transmission curve of a maximum amplification of the audio signal is able to be set via the frequency. There may be a reduction in gain in the higher frequencies to counteract feedback whistling, which frequently occurs, especially at high frequencies.

Furthermore a method for setting audiological or acoustic parameters is known from publication EP 0 917 398 A2. This too is designed to enable the user-specific parameters, such as the gain in the individual channels on the hearing device for example, to be controlled.

A method and a hearing device for compensating for hearing defects are described in the publication DE 27 16 336 B1. It is mentioned that the hearing device can be equipped with a tone balancing unit. Patent application DE 31 41 420 C2 further discloses a hearing device in which the reduction in low tones is to be expanded. A tone see-saw with increased reduction of low frequencies is therefore used.

The object of the present invention thus consists of using the advantages of a tone balance unit in a hearing apparatus and especially in a hearing device.

Inventively this object is achieved by a hearing apparatus with a signal processing device by which signals are able to be processed in a number of signal channels, and a control device for controlling the level of the individual frequency channels, with the control device featuring an unsymmetrical tone balance unit related to a predetermined frequency, with which at least one lower frequency channel related to the predetermined frequency and at least one upper channel of the number of frequency channels are able to be adjusted simultaneously unsymmetrically to the predetermined frequency.

In addition a method is provided in accordance with the invention for controlling a hearing apparatus by processing signals in the hearing apparatus in a number of frequency bands, controlling the level of the individual frequency channels, with the control of the level corresponding to an unsymmetrical tone balance in relation to a predefined frequency, with the at least one lower frequency channel related to the predetermined frequency and at least one upper channel of the number of frequency channels being able to be adjusted simultaneously unsymmetrically to the predetermined frequency.

Advantageously this allows a tone balance adapted to physiological, technical and subjective general conditions to be used in a hearing apparatus. This enables the tone balance unit to also be provided to users for whom the control range of the symmetrical tone balance unit would be too small.

In a specific embodiment the level of the lowest frequency channels or channel is not changed by the tone balance unit when the level of the uppermost frequency channel changes. What this specific tone balance unit achieves is that the impression of loudness barely changes during adjustment.

Preferably the maximum adjustment range of the tone balance in a frequency channel is restricted by a feedback limit. In this way feedback artifacts produced by high gain in specific frequency ranges can be avoided in advance.

BRIEF DESCRIPTION OF THE DRAWINGS

The present invention is explained in greater detail with reference to the enclosed drawings, in which the figures show:

FIG. 1 a diagram of the basic signal processing components of a behind-the ear hearing device;

FIG. 2 a diagram of the control ranges of different frequency channels;

FIG. 3 a diagram of a symmetrical tone balance;

FIG. 4 an unsymmetrical tone balance unit as claimed in a first embodiment; and

FIG. 5 an unsymmetrical tone balance unit as claimed in a second embodiment.

DETAILED DESCRIPTION OF INVENTION

The exemplary embodiments illustrated in greater detail below represent preferred forms of embodiment of the present invention.

FIG. 2 shows symbolically four frequency channels f1, f2, f3 and f4 for a signal processing unit of a hearing device. Frequency channel f1 is the channel with the lowest frequencies and frequency channel f4 the channel with the highest frequencies. The frequency bands f2 and f3 lie correspondingly between the two. The maximum volume control range VOL is identified for each frequency channel by a small rectangular box. A start position is indicated in the middle of the volume control ranges, which is produced with a so-called "First Fit". This start position represents an average volume which could be determined for an individual hearing device wearer for a first fit. From this average volume or start position the hearing device wearer can lower or raise the volume in the maximum range VOL with the volume control.

With a balance control the volume in a channel can likewise be changed independently of the setting of the volume control. For a maximum setting of the volume control at the upper limit of the volume control range VOL the volume can also be further increased by the balance control, as is indicated by the vertical marks above the box for each frequency channel. The volume can be further reduced in the same way by the balance control, if the volume control has been set to its quietest setting. This is indicated by the vertical marks below the box in FIG. 2. Overall a total volume control range VOL+BAL is produced by the volume control and the balance control.

Additionally shown in FIG. 2 is a respective feedback limit r1, r2, r3 and r4 for each frequency channel f1 to f4. Provided the volume set by the volume control and the balance control remains below the respective feedback limit r1 to r4, the hearing device wearer or user will barely be able to perceive any feedback.

FIG. 3 now shows a symmetrical tone balance unit, but this is not however claimed here. Compared to the example of FIG. 2 the gap between the recommended setting (First Fit) and the feedback limit r4' is very small here in the uppermost channel f4. Given that the maximum volume control range VOL remains the same, the maximum balance control range must be reduced so that in the uppermost frequency channel the feedback limit r4' is not exceeded by the overall control range VOL+BAL.

A maximum setting of a symmetrical tone balance unit is further shown in FIG. 3 by the four asterisks (*). For this setting of the balance control the high frequencies are emphasized to the same extant as the low frequencies are attenuated. The symmetry relates here to the average between channels f2 and f3, if necessary at a fictional frequency, but at one which is predetermined. The basis for this symmetrical balance unit is setting the volume control to its upper limit. It should be recognized that only a slight adjustment of the balance control from the horizontal is sufficient for the gain in the uppermost frequency channel to reach the feedback limit r4'. It thus hardly makes sense here to provide the user with a symmetrical tone balance unit, since the control range for the symmetrical tone balance unit would be too small.

It is now helpful in this situation to provide an inventive unsymmetrical tone balance control unit, for example in accordance with FIG. 4. The asymmetry again relates to a predetermined frequency, e.g. a mid-frequency channel or the average of two frequency channels. With this unsymmetrical tone balance unit the balance control tends to alter the lows rather than the highs, so that at least with the lows (frequency channels f1, f2) the control range or setting range remains very large. In the example of FIG. 4 the volume control setting is not altered by the balance control in the uppermost frequency channel f4, whereas in the second-highest frequency channel f3 it is altered slightly, but much less than in the lower frequency channels f1 and f2 by the balance control. If the balance control is not set however the respective feedback limit r1, r2, r3, r4' is reached or exceeded, although the user in the lower frequency range has a large range of balance adjustment available. A suitable tone balance unit could thus be provided for the specific feedback situation, i.e. the general technical conditions for wearing the hearing apparatus.

As is indicated in the introductory part of the description, the impression of loudness alters especially through changes to the volume level at low frequencies. The symmetrical tone balance unit of FIG. 3 is thus unsuitable if a balance control is to be undertaken and the impression of loudness is to be retained when this is done. It can thus be seen from FIG. 3 that the level in the low frequency channels f1 and f2 falls if the highs are increased in channels f3 and f4 by the balance controller. The output signal is thus perceived as less loud.

To avoid wide variations in the impression of loudness on adjustments of the balance control, an unsymmetrical tone balance unit in accordance with FIG. 5 is used for example. With this tone balance unit the lowest frequencies in channel f1 will not be influenced by the balance control and will be influenced only slightly in the second lowest channel. In the two upper frequency channels f3 and f4 by contrast the maximum range of control is available to the balance control. With this tone balance unit the user thus essentially alters the highs through the balance control, which, although they make a large contribution to the impression of tone, contribute less to the impression of loudness. This especially allows the impression of loudness that the acoustic technician has precisely optimized during the fitting process to be maintained since the lows practically do not change.

In above examples the inventive tone balance unit has been explained with reference to four frequency channels. An unsymmetrical tone balance unit can however also be implemented for any other given number of frequency channels, beginning with two.

In addition it has been shown in the examples that the high frequencies and the low frequencies will be adjusted once by the balance control, whereas the others will be altered more or less greatly. An unsymmetrical tone balance unit can however represent any function relating to frequency which is similar to a balance with two arms movable in opposite directions. Extreme examples are the forms of embodiment shown in FIG. 3 and FIG. 5 for which one of the two balance arms has the length zero. The only significant fact is that the arms are not the same length as they are for a symmetrical tone balance unit and lie on a straight line.

The invention claimed is:

1. A hearing apparatus, comprising
a signal processing device to process a plurality of signals in a plurality of frequency channels including a first channel for a first frequency and at least a second channel for at least one higher frequency than the first frequency; and
a control device configured to control respective levels of the plurality of frequency channels with a tone balance unit related to a predetermined frequency, wherein the tone balance unit is configured to simultaneously and unsymmetrically adjust the first channel and the at least second channel relative to the predetermined frequency, wherein the tone balance unit is further configured to adjust a level of at least one signal corresponding to a respective higher frequency channel without affecting a level of a signal corresponding to a lowest frequency channel.

2. The hearing apparatus as claimed in claim 1, wherein the tone balance unit is configured to provide a first amount of signal level adjustment at least to a signal corresponding to a respective highest frequency channel and provide a second amount of signal level adjustment to a signal in a frequency channel adjacent to a lowest frequency channel without affecting the level of the signal corresponding to the lowest frequency channel, wherein the first amount of signal level adjustment is larger relative to the second amount of signal level adjustment.

3. The hearing apparatus as claimed in claim 1, wherein a respective maximum control range of the tone balance unit in each of the frequency channels is restricted by a respective feedback limit.

4. A method for controlling a hearing apparatus by
processing a plurality of signals in the hearing apparatus via a plurality of frequency channels including a first channel for a first frequency and at least one upper frequency channel for at least one higher frequency than the first frequency;
controlling respective levels of the plurality of frequency channels via an asymmetric tone balance unit related to a predetermined frequency such that the first frequency channel and the at least one upper frequency channels are simultaneously and unsymmetrically adjustable relative to the predetermined frequency; and
adjusting a level of at least one signal corresponding to the at least one upper frequency channel without affecting a level of a signal corresponding to a lowest frequency channel.

5. The method as claimed in claim 4, arranging the tone balance unit to provide a first amount of signal level adjustment at least to a signal corresponding to a respective highest frequency channel and provide a second amount of signal level adjustment to a signal in a frequency channel adjacent to a lowest frequency channel without affecting the level of the signal corresponding to the lowest frequency channel, wherein the first amount of signal level adjustment is larger relative to the second amount of signal level adjustment.

6. The method as claimed in claim 4, further comprising restricting a respective maximum control range of the tone balance unit in each frequency channel by a respective feedback limit.

* * * * *